(12) United States Patent
Stockinger

(10) Patent No.: US 9,438,030 B2
(45) Date of Patent: Sep. 6, 2016

(54) TRIGGER CIRCUIT AND METHOD FOR IMPROVED TRANSIENT IMMUNITY

(71) Applicant: Michael A. Stockinger, Austin, TX (US)

(72) Inventor: Michael A. Stockinger, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 515 days.

(21) Appl. No.: 13/682,604

(22) Filed: Nov. 20, 2012

(65) Prior Publication Data

US 2014/0139963 A1 May 22, 2014

(51) Int. Cl.
*H02H 9/00* (2006.01)
*H03K 19/003* (2006.01)

(52) U.S. Cl.
CPC ........ *H02H 9/005* (2013.01); *H03K 19/00315* (2013.01)

(58) Field of Classification Search
USPC ............................................ 361/56
See application file for complete search history.

(56) References Cited

U.S. PATENT DOCUMENTS

| | | | |
|---|---|---|---|
| 5,255,146 A | 10/1993 | Miller | |
| 5,463,520 A * | 10/1995 | Nelson | ............................ 361/56 |
| 5,508,649 A | 4/1996 | Shay | |
| 5,917,689 A | 6/1999 | English et al. | |
| 6,385,021 B1 | 5/2002 | Takeda et al. | |
| 6,400,546 B1 | 6/2002 | Drapkin et al. | |
| 6,724,601 B2 | 4/2004 | Lien et al. | |
| 6,724,603 B2 | 4/2004 | Miller et al. | |
| 6,760,209 B1 | 7/2004 | Sharpe-Geisler | |
| 7,245,468 B2 | 7/2007 | Griesbach et al. | |
| 7,522,395 B1 | 4/2009 | Tien et al. | |
| 7,876,540 B2 * | 1/2011 | Deval et al. | ..................... 361/56 |
| 2003/0076640 A1 | 4/2003 | Malherbe et al. | |
| 2004/0125521 A1 | 7/2004 | Salling et al. | |
| 2007/0115600 A1 | 5/2007 | Lohr et al. | |
| 2007/0247772 A1 | 10/2007 | Keppens et al. | |
| 2007/0285854 A1 | 12/2007 | Rodgers et al. | |
| 2008/0007882 A1 | 1/2008 | Bernard et al. | |
| 2008/0239599 A1 | 10/2008 | Yizraeli et al. | |

(Continued)

FOREIGN PATENT DOCUMENTS

JP  H03222516 A  10/1991

OTHER PUBLICATIONS

Gerdemann, A. et al., "When Good Trigger Circuits Go Bad: A Case History," IEEE 33rd Electrical Overstress/Electrostatic Discharge Symposium; Sep. 11-16, 2011; 6 pages.

(Continued)

*Primary Examiner* — Ronald W Leja

(57) ABSTRACT

A trigger circuit detects a transient voltage increase on an integrated circuit. The trigger circuit controls a conductivity state of a clamping device to limit the transient voltage increase. The trigger circuit comprises a common capacitive element having a capacitive value, wherein a first time value and a second time value are dependent upon the capacitive value of the common capacitive element, the first time value applicable to an unpowered state of the integrated circuit and the second time value applicable to a powered state of the integrated circuit. The first time value and the second time value control a trigger circuit parameter which may include a detection range within which a rate of transient voltage increase causes the trigger circuit to become active or an "on" time upon which an active duration of control of the conductivity state of the clamping device depends.

17 Claims, 6 Drawing Sheets

(56) References Cited

U.S. PATENT DOCUMENTS

| | | |
|---|---|---|
| 2009/0040671 A1 | 2/2009 | Zhang |
| 2009/0067104 A1 | 3/2009 | Stockinger et al. |
| 2009/0201615 A1 | 8/2009 | Bernard et al. |
| 2009/0268360 A1 | 10/2009 | Shinomiya et al. |
| 2011/0222196 A1 | 9/2011 | Smith |
| 2011/0267723 A1 | 11/2011 | Stockinger et al. |
| 2014/0022678 A1* | 1/2014 | Maile ............ H02H 3/20 361/56 |
| 2014/0139963 A1* | 5/2014 | Stockinger ....... H03K 19/00315 361/111 |

OTHER PUBLICATIONS

Non-Final Office Action mailed Aug. 17, 2012 for U.S. Appl. No. 12/772,769, 13 pages.

Notice of Allowance mailed Feb. 6, 2013 for U.S. Appl. No. 12/772,769, 8 pages.

* cited by examiner

TRIGGER CIRCUIT AND METHOD FOR IMPROVED TRANSIENT IMMUNITY

CROSS-REFERENCE TO RELATED APPLICATION(S)

The present application is related to co-pending U.S. patent application Ser. No. 12/772,769, entitled "OVER-VOLTAGE PROTECTION CIRCUIT FOR AN INTEGRATED CIRCUIT," filed on May 3, 2010, the entirety of which is herein incorporated by reference.

BACKGROUND

Field of the Disclosure

This disclosure relates generally to integrated circuits (ICs) and more specifically to transient immunity for integrated circuits.

Electronic circuits are designed to operate over limited voltage ranges. Exposure to voltages beyond those limited voltage ranges can damage or destroy those circuits. The problem is particularly notable for integrated circuits, which often have many external terminals connected to circuitry fabricated on a very small scale.

While transient voltage suppression circuits for integrated circuits exist, they tend not to function well for both unpowered transient events (i.e., those transient events occurring when the integrated circuit is not powered up for normal operation) and powered transient events (i.e., those transient events occurring when power is applied to the integrated circuit for normal operation).

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

A trigger circuit (TC) for improved transient immunity is provided. The trigger circuit detects a transient voltage increase on the integrated circuit on which it is fabricated. The trigger circuit controls a conductivity state of a clamping device on the integrated circuit to limit the transient voltage increase. The trigger circuit comprises a common capacitive element having a capacitive value, wherein a first time value and a second time value are dependent upon the capacitive value of the common capacitive element, the first time value applicable to an unpowered state of the integrated circuit and the second time value applicable to a powered state of the integrated circuit. The first time value and the second time value control a trigger circuit parameter which may include a detection range within which a rate of transient voltage increase causes the trigger circuit to become active or an "on" time upon which an active duration of control of the conductivity state of the clamping device depends.

Figure 1:
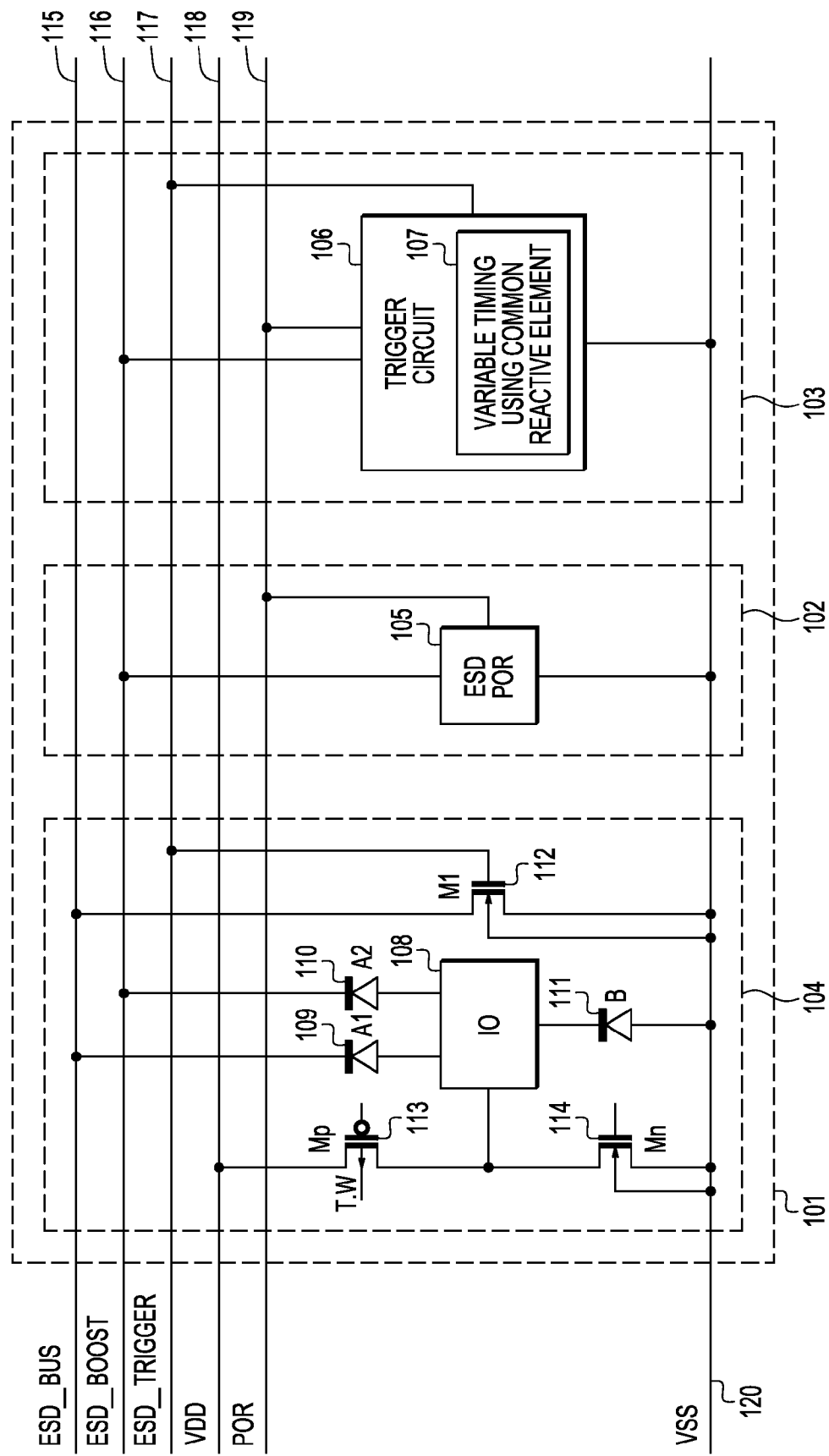
FIG. 1 is a block diagram illustrating a transient suppression system comprising a trigger circuit with a variable timing block using a common reactive element to provide multiple time values in accordance with at least one embodiment.

FIG. 1 is a block diagram illustrating a transient suppression system comprising a trigger circuit with a variable timing block using a common reactive element to provide multiple time values in accordance with at least one embodiment. Transient suppression system 101 comprises an electrostatic discharge (ESD) power-on reset (POR) module 102, a trigger circuit module 103, and an input-output (IO) module 104. Transient suppression system 101 also comprises a plurality of voltage rails and signaling buses and a transient suppression bus. For example, transient suppression system 101 comprises positive voltage rail VDD 118 and negative voltage rail VSS 120, ESD voltage rail ESD_BOOST 116, signaling buses POR 119 and ESD_TRIGGER 117, and transient suppression bus ESD_BUS 115. Positive voltage rail VDD 118 and negative voltage rail VSS 120 provide power to system components protected by the transient suppression system 101 for the usual operation of such system components, with negative voltage rail VSS 120 generally thought of as a ground reference potential with respect to which other voltages are referenced. ESD voltage rail ESD_BOOST 116 is energized by a transient event and provides power to transient suppression system 101 elements to allow them to actively operate to detect and control transient events. Signaling bus POR 119 receives a POR signal from POR module 102 and provides that POR signal to trigger circuit module 103. Signaling bus ESD_TRIGGER 117 receives a trigger signal TRIG from trigger circuit module 103 and provides that trigger signal TRIG to IO module 104. Transient suppression bus ESD_BUS 115 allows large current flows resulting from suppression of transient events to bypass usual voltage rails, such as positive voltage rail VDD 118, preventing large excursions of the positive supply voltage at positive voltage rail VDD 118.

ESD POR module 102 comprises ESD POR circuit block 105. A positive supply terminal of ESD POR circuit block 105 is connected to ESD voltage rail ESD_BOOST 116. A negative supply terminal of ESD POR circuit block 105 is connected to voltage rail VSS 120. A POR output of ESD POR circuit block 105 is connected to signaling bus POR 119. Trigger circuit module 103 comprises trigger circuit block 106. Trigger circuit block 106 comprises variable timing circuit block 107, which comprises a common reactive element used to provide multiple time values. A positive supply terminal of trigger circuit block 106 is connected to ESD voltage rail ESD_BOOST 116. A negative supply terminal of trigger circuit block 106 is connected to negative voltage rail VSS 120. A POR input terminal of trigger circuit block 106 is connected to signaling bus POR 119. A trigger output of trigger circuit block 106 is connected to signaling bus ESD_TRIGGER 117.

IO module 104 comprises IO pad 108, diode 109, diode 110, diode 111, clamping device 112, positive output driver 113, and negative output driver 114. IO pad 108 provides a conductive connection for an external terminal (e.g., pin, ball, bump, land, or the like) of the integrated circuit on which the transient suppression system 101 is fabricated. Diodes 109, 110, and 111 provide paths for currents to maintain voltage relationships between nodes or buses based on the current-voltage (I-V) curves of diodes 109, 110, and 111. Such nodes or buses between which diodes are used to maintain voltage relationships may include IO pad 108, transient suppression bus ESD_BUS 115, ESD voltage rail ESD_BOOST 116, positive voltage rail VDD 118, and negative voltage rail VSS 120. For example, additional diodes configured similarly to diodes 109, 110, and 111 of IO module 104 may be used in a VDD pad cell for positive voltage rail VDD 118. Therefore, transient suppression bus ESD_BUS 115 is pulled up by a VDD pad cell diode analogous to diode 109 of IO pad cell module 104 to at least a diode drop below the voltage of positive voltage rail VDD 118. Accordingly, the voltage of positive voltage rail VDD 118 tends to play a large role in determining the voltage of transient suppression bus ESD_BUS 115. If the IOs are switching within a range between negative voltage rail VSS 120 and positive voltage rail VDD 118 (e.g., during normal chip operation), the voltage of transient suppression bus ESD_BUS 115 should not be affected by the presence of diodes such as diodes 109, 110, 111 in the IO module, or their counterparts in the VDD pad cell. Likewise, a diode in the VDD pad cell similar to diode 110 of IO module 104 serves to precondition ESD voltage rail ESD_BOOST 116 at a diode drop below the voltage of positive voltage rail VDD 118, and, for IOs switching within the range between negative voltage rail VSS 120 and positive voltage rail VDD 118 (e.g., during normal chip operation), the voltage of ESD voltage rail ESD_BOOST 116 should not be affected by the presence of diodes such as diodes 109, 110, 111 in IO module 104, or their counterparts in the VDD pad cell. Diode 109 passes current between IO pad 108 and transient suppression bus ESD_BUS 115 when a positive voltage overstress event is applied to IO pad 108. For example, when the voltage at IO pad 108 rises to more than one diode drop above the voltage of transient suppression bus ESD_BUS 115, diode 109 will conduct. Diode 110 passes current between IO pad 108 and ESD voltage rail ESD_BOOST 116 when a positive voltage overstress event occurs at IO pad 108. For example, when the voltage at IO pad 108 rises to more than one diode drop above the voltage of ESD voltage rail ESD_BOOST 116, diode 110 will conduct. Diode 111 provides a current path from negative voltage rail VSS 120 to IO pad 108 in the event that there is a negative voltage overstress event on IO pad 108. For example, when the voltage at IO pad 108 falls to more than one diode drop below the voltage of negative voltage rail VSS 120, diode 111 will conduct. Clamping device 112, which may, for example, be a N-channel metal oxide semiconductor field effect transistor (MOSFET), has a first terminal (e.g., a drain terminal) connected to transient suppression bus ESD_BUS 115, a second terminal (e.g., a source terminal) connected to negative voltage rail VSS 120, a control terminal (e.g., a gate terminal) connected to signaling bus ESD_TRIGGER 117, and a body terminal connected to negative voltage rail VSS 120. Positive output driver 113, which may, for example, be a P-channel MOSFET, has a first terminal (e.g., a source terminal) connected to positive voltage rail VDD 118, a second terminal (e.g., a drain terminal) connected to IO pad 108, a control terminal (e.g., a gate terminal) connected to an output driver circuit for causing positive output driver 113 to drive IO pad 108 to a high logic level, and a body terminal connected to a tracking well control circuit. The tracking well control circuit maintains the body terminal of positive output driver 113 at the higher of a voltage of positive voltage rail VDD 118 and a voltage of IO pad 108 to avoid allowing current to be injected from IO pad 108 to positive voltage rail VDD 118. Negative output driver 114, which may, for example, be a N-channel MOSFET, has a first terminal (e.g., a drain terminal) connected to IO pad 108, a second terminal (e.g., a source terminal) connected to negative voltage rail VSS 120, a control terminal (e.g., a gate terminal) connected to the output driver circuit for causing negative output driver 114 to drive IO pad 108 to a low logic level, and a body terminal connected to negative voltage rail VSS 120.

As an example, the transient suppression system 101 of FIG. 1 may be applied to pad ring scenarios, such as where multiple IO pads 108 can share one trigger circuit. For example, a trigger circuit module 103 may be placed with a certain ratio of IO modules 104 to TC modules 103 (e.g., 8:1). Also, an IO segment comprising multiple IO modules 104 may be served by a single ESD POR module 102. The single ESD POR module 102 may be coupled to multiple trigger circuit modules 103, which may provide a trigger signal TRIG via signaling bus ESD_TRIGGER 117 to the multiple IO modules 104 of the IO segment. Thus, ESD POR module 102, trigger circuit module 103, and 10 module 104 may be implemented at a 1:1:n ratio, where n is greater than one. Alternatively, ESD POR module 102, trigger circuit module 103, and 10 module 104 may be implemented at a 1:1:1 ratio, a 1:x:x, ratio, where x is greater than one, or a 1:x:y ratio, where x is greater than one and y is greater than x.

Figure 2:
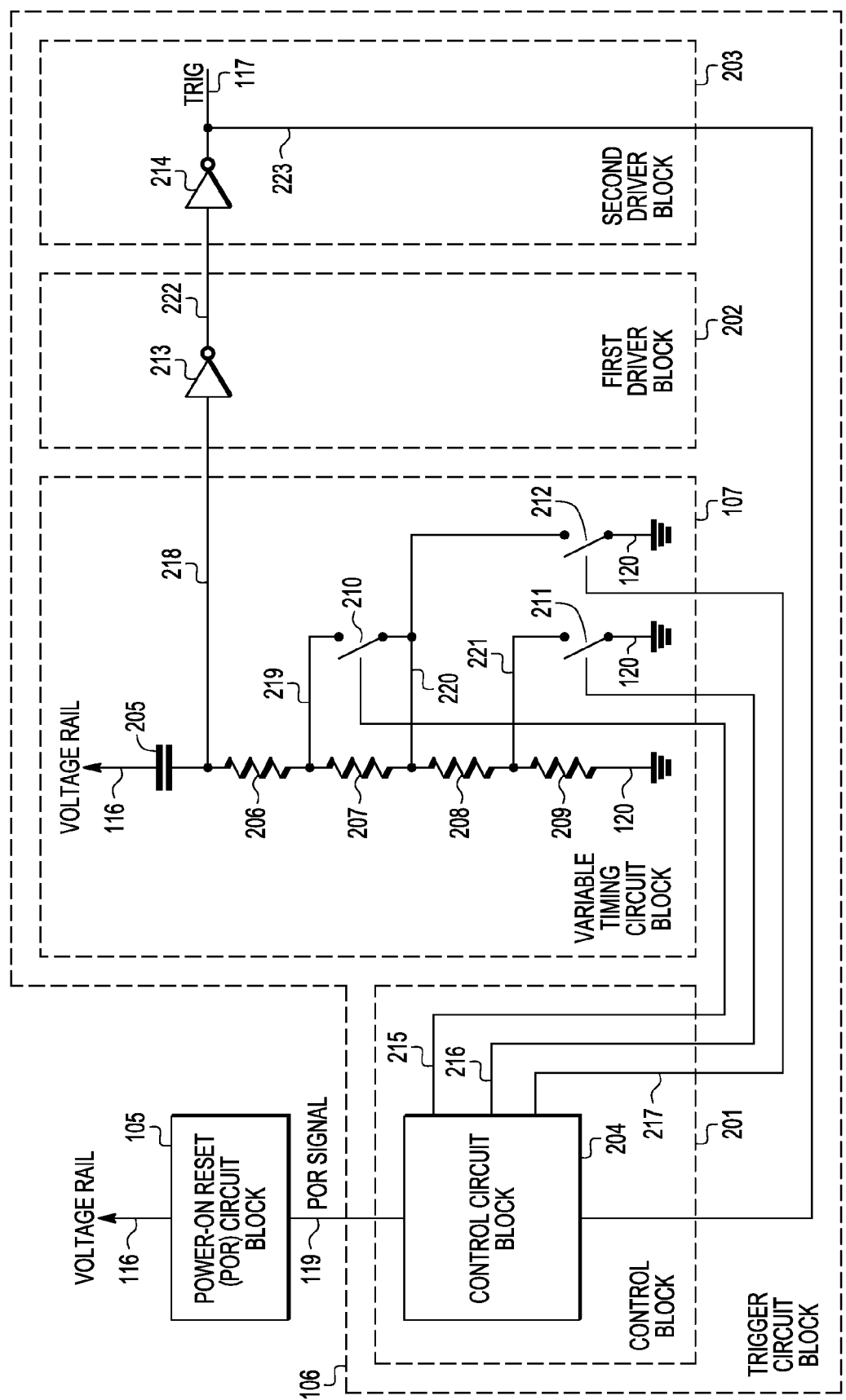
FIG. 2 is a simplified schematic diagram illustrating a trigger circuit with switchable resistive elements and a common capacitive element to provide multiple time values in accordance with at least one embodiment.

FIG. 2 is a simplified schematic diagram illustrating a trigger circuit with switchable resistive elements and a common capacitive element to provide multiple time values in accordance with at least one embodiment. Trigger circuit block 106 comprises control block 201, variable timing circuit block 107, first driver block 202, and second driver block 203. Control block 201 comprises control circuit block 204. A voltage rail, such as ESD voltage rail ESD_BOOST 116, is connected to ESD POR circuit block 105. ESD POR circuit block 105 provides a POR signal via signaling bus POR 119 to control circuit block 204 of control block 201 of trigger circuit block 106. Control circuit block 204 provides a first switch control output 215 connected to a control terminal of switch 210 to control switch 210, a second switch control output 216 connected to a control terminal of switch 211 to control switch 211, and third switch control output 217 connected to a control terminal of switch 212 to control switch 212. Control circuit block 204 receives a trigger signal TRIG from second driver block 203. Control circuit block 204 asserts the first switch control output 215, the second switch control output 216, and the third switch control output 217 to control switches 210, 211, and 212, respectively, in response to a state of the POR signal and a state of the trigger signal TRIG.

Variable timing circuit block 107 comprises common capacitive element 205, resistive element 206, resistive element 207, resistive element 208, resistive element 209, switch 210, switch 211, and switch 212. Common capacitive element 205 may be implemented, for example, as a metal oxide semiconductor field effect transistor (MOSFET), as a varactor diode, as a metal-insulator-metal (MIM) capacitor, or as any other suitable element providing suitable values of capacitance. Resistive elements 206, 207, 208, and 209 may be implemented, for example, as resistors, as MOSFETs configured to provided desired "on" resistances, as bipolar transistors configured to provide current flows corresponding to desired resistances, or as any other suitable element for providing suitable values of resistance. A voltage rail, such as ESD voltage rail ESD_BOOST 116, is connected to a first terminal of common capacitive element 205. A second terminal of common capacitive element 205 is connected to node 218, which is connected to a first terminal of resistive element 206 and to an input of inverter 213 of first driver block 202. A second terminal of resistive element 206 is connected to node 219, which is connected to a first terminal of resistive element 207 and to a first terminal of switch 210. A second terminal of the resistive element 207 is connected to node 220, which is connected to a second terminal of switch 210, to a first terminal of resistive element 208, and to a first terminal of switch 212. The second terminal of resistive element 208 is connected to a first terminal of resistive element 209 and to a first terminal of switch 211. A second terminal of resistive element 209 is connected to negative voltage rail VSS 120. A second terminal of switch 211 is connected to negative voltage rail VSS 120. A second terminal of switch 212 is connected to negative voltage rail VSS 120.

A truth table for the POR signal, the trigger signal TRIG, the corresponding states of switch 210, switch 211, and switch 212, and the corresponding series combinations of resistive element 206, resistive element 207, resistive element 208, and resistive element 209 is shown below in Table 1:

TABLE 1

Switch states and resistive element combinations

| | TRIG = 1 (e.g., to control the active duration of clamping) | TRIG = 0 (e.g., to control a detection range) |
|---|---|---|
| POR = 1 (e.g., during unpowered state) | Switch 210 = 1<br>Switch 211 = 1<br>Switch 212 = 0<br>(Resistive element 206 + Resistive element 208)<br>(e.g., approximately 5 microsecond time value) | Switch 210 = 1<br>Switch 211 = X<br>Switch 212 = 1<br>(Resistive element 206)<br>(e.g., approximately 100 nanosecond time value) |
| POR = 0 (e.g., during powered state) | Switch 210 = 0<br>Switch 211 = 0<br>Switch 212 = 0<br>(Resistive element 206 + Resistive element 207 + Resistive element 208 + Resistive element 209)<br>(e.g., approximately 20 millisecond time value) | Switch 210 = 0<br>Switch 211 = X<br>Switch 212 = 1<br>(Resistive element 206 + Resistive element 207)<br>(e.g., approximately 10 microsecond time value) |

In Table 1, for the POR signal and the trigger signal TRIG, a zero denotes a low logic level and a one denotes a high logic level. For switches 210, 211, and 212, a zero denotes an open switch, a one denotes a closed switch, and an "X" denotes a switch that may be either open or closed without affecting the resulting resistance value. For the resistive elements, a plus sign denotes the summation of their resistances, as they are combined in a series combination. In accordance with at least one other embodiment, opposite logic levels may be used, different switch nomenclature may be used, or different configurations of resistive elements may be used. As an example, parallel combinations of resistive elements may be used or a combination of series and parallel combinations of resistive elements may be used. In accordance with at least one embodiment, resistive element 206, in combination with common capacitive element 205, provides a time value (e.g., resistive-capacitive (RC) time constant) of approximately 100 nanoseconds, the series combination of resistive element 206 and resistive element 208, in combination with common capacitive element 205, provides a time value (e.g., RC time constant) of approximately 5 microseconds, the series combination of resistive element 206 and resistive element 207, in combination with common capacitive element 205, provides a time value (e.g., RC time constant) of approximately 10 microseconds, and the series combination of resistive element 206, resistive element 207, resistive element 208, and resistive element 209, in combination with common capacitive element 205, provides a time value (e.g., RC time constant) of approximately 20 milliseconds.

Figure 3:
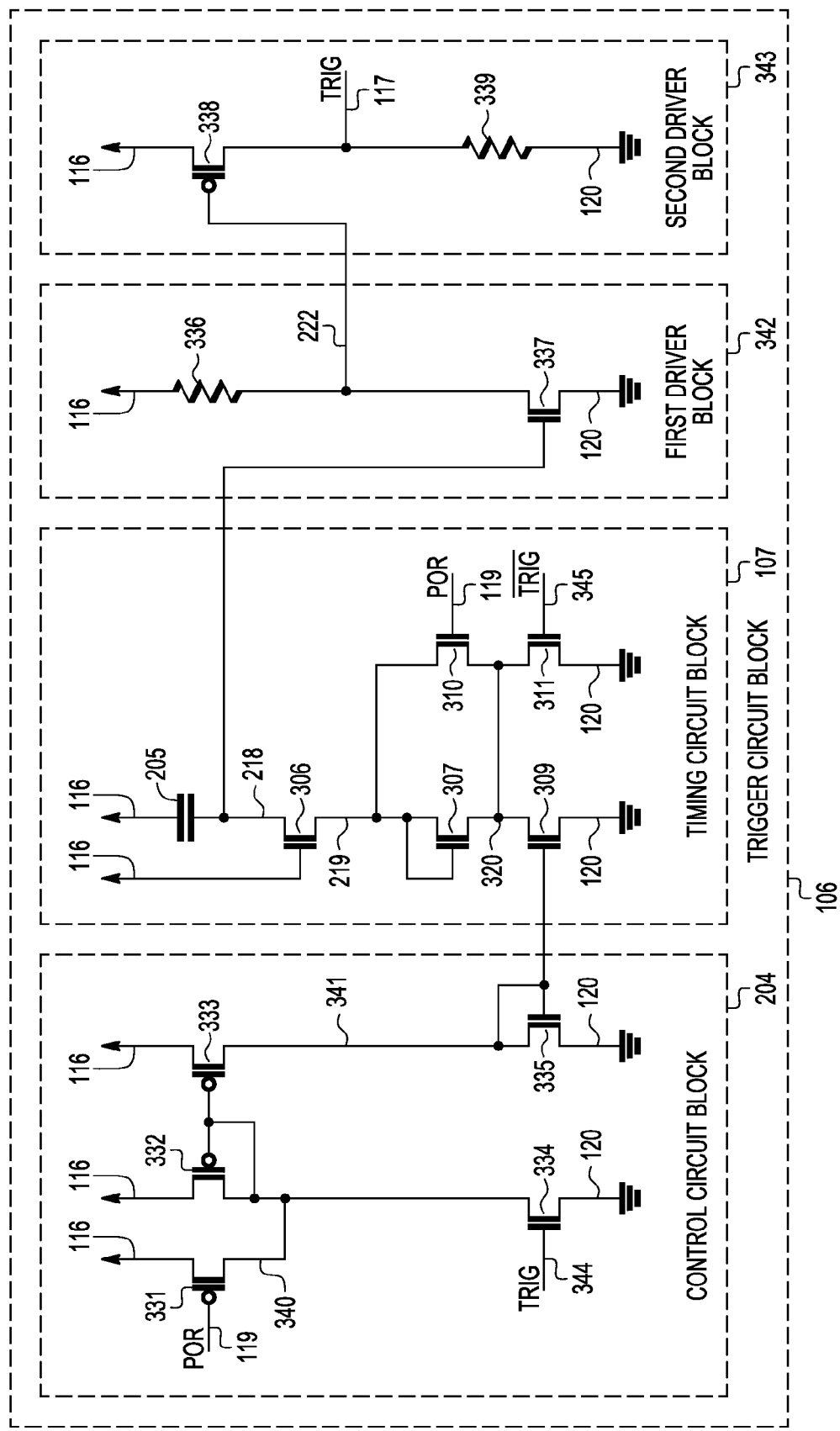
FIG. 3 is a schematic diagram illustrating a complementary metal oxide semiconductor (CMOS) implementation of a trigger circuit in accordance with at least one embodiment.

First driver block 202 comprises inverter 213. Inverter 213 may be configured to have a low inverter switch point (e.g., lower than 50% of a difference between positive voltage rail VDD 118 and negative voltage rail VSS 120), allowing a slight increase in voltage from a low logic level to be interpreted as a high logic level and to switch the inverter from providing a high logic level output to providing a low logic level output. Second driver block 203 comprises inverter 214. Inverter 213 and inverter 214 are configured to provide limited gain so as to avoid instability and oscillations. For example, inverter 213 and inverter 214 may be implemented using resistive elements 336 and 339, respectively, as illustrated in FIG. 3, or using other inverters configured to provide adequately limited gain. Node 218 is connected to the input of inverter 213. The output of inverter 213 is connected to node 222, which is connected to the input of inverter 214 of second driver block 203. The output of second driver block provides a trigger signal TRIG at node 223 which is connected to a trigger input of control circuit block 204 of control block 201. The trigger signal TRIG may also be used to control a conductivity state of a clamping device. Communication of the trigger signal TRIG at node 223 may be provided via signaling bus ESD_TRIGGER 117, which may be connected to node 223. Feedback of the trigger signal TRIG at node 223 within the trigger circuit block 106 may be accomplished via an internal conductor within trigger circuit block 106.

To provide an on/off-style triggering mode which may, for example, be used during an unpowered state of an integrated circuit, the POR signal has a value of one and the trigger signal TRIG has a value of zero, as shown in Table 1 above. The control circuit block 204 causes switches 210, 211, and 212 to select resistive element 206 by itself to determine, in conjunction with common capacitive element 205, a time value (e.g., of approximately 100 nanoseconds) for controlling a detection range of a rate of transient voltage increase of ESD voltage rail ESD_BOOST 116. A relatively slow increase in the voltage on the ESD voltage rail ESD_BOOST 116 (e.g., as might occur when power is applied to the integrated circuit and the voltage of ESD voltage rail ESD_BOOST 116 rises) allows resistive element 206 to provide sufficient current flow to charge common capacitive element 205 and increase the voltage across common capacitive element 205 as the voltage on the ESD voltage rail ESD_BOOST 116 rises, which keeps the voltage at node 218 from rising substantially relative to negative voltage rail VSS 120. Thus, first driver block 202 and second driver block 203 remain unchanged, and the trigger signal TRIG at node 223 remains unchanged, as the slow increase in voltage of ESD voltage rail ESD_BOOST 116 was not enough to trigger the trigger circuit. However, a very rapid increase in voltage on the ESD voltage rail ESD_BOOST 116 (e.g., as might occur during a transient voltage stress event, such as an ESD event) causes node 218 to be pulled up in voltage very rapidly. The very rapid increase in the voltage at node 218 increases the voltage at the control terminal (e.g., gate terminal) of N-channel MOSFET 337, causing first driver block 202 and second driver block 203 to quickly activate the trigger signal TRIG at node 223, which is provided to a clamping device to initiate an activation of the clamping device and which is fed back to control circuit block 204 to determine an activation duration for the activation of the clamping device.

To provide a relatively short activation duration which may, for example, be used during an unpowered state of an integrated circuit, the POR signal has a value of one and the trigger signal TRIG has a value of one, as shown in Table 1 above. The control circuit block 204 causes switches 210, 211, and 212 to select a series combination of resistive elements 206 and 208 to determine, in conjunction with common capacitive element 205, a time value (e.g., of approximately 5 microseconds) for controlling an activation duration of an activation of a clamping device. The voltage on the ESD voltage rail ESD_BOOST 116 then charges common capacitive element 205 through the series combination of resistive elements 206 and 208. When common capacitive element 205 is charged to a voltage high enough to depress the voltage at node 218 and enough to change the state of first driver block 202 and second driver block 203, the trigger signal TRIG at node 223 is deactivated, deactivating any clamping device controlled by it.

To provide a voltage regulation mode which may, for example, be used during a powered state of an integrated circuit, the POR signal has a value of zero and the trigger signal TRIG has a value of zero, as shown in Table 1 above. The control circuit block 204 causes switches 210, 211, and 212 to select a series combination of resistive elements 206 and 207 to determine, in conjunction with common capacitive element 205, a time value (e.g., of approximately 10 microseconds) for controlling a detection range of a rate of transient voltage increase of ESD voltage rail ESD_BOOST 116. A slow increase in the voltage on the ESD voltage rail ESD_BOOST 116 allows the series combination of resistive elements 206 and 207 to provide sufficient current flow to charge common capacitive element 205 and increase the voltage across common capacitive element 205 as the voltage on the ESD voltage rail ESD_BOOST 116 rises, which keeps the voltage at node 218 from rising substantially relative to negative voltage rail VSS 120. Thus, first driver block 202 and second driver block 203 remain unchanged, and the trigger signal TRIG at node 223 remains unchanged, as the slow increase in voltage of ESD voltage rail ESD_BOOST 116 was not enough to trigger the trigger circuit. However, a rapid increase in voltage on the ESD voltage rail ESD_BOOST 116 causes node 218 to be pulled up in voltage roughly proportional to the change in the ESD_BOOST voltage, as a high resistance of the series combination of resistive elements 206 and 207 (as compared to the lower resistance of resistive element 206 by itself, for example, in the unpowered state) prevents the charge of common capacitive element 205 (and thus the voltage across common capacitive element 205) from changing rapidly. The increase in the voltage at node 218 increases the voltage at the control terminal (e.g., gate terminal) of N-channel MOSFET 337 roughly in proportion to the ESD_BOOST voltage increase, which is amplified by the gain of inverter 213 of first driver block 202. Second driver block 203 inverts the output of first driver block to provide a trigger signal TRIG at node 223 which is provided to a clamping device to initiate an activation of the clamping device and which is fed back to control circuit block 204 to determine an activation duration for the activation of the clamping device.

To provide a relatively long activation duration which may, for example, be used during a powered state of an integrated circuit, the POR signal has a value of zero and the trigger signal TRIG has a value of one, as shown in Table 1 above. The control circuit block 204 causes switches 210, 211, and 212 to select a series combination of resistive elements 206, 207, 208, and 209 to determine, in conjunction with common capacitive element 205, a time value (e.g., of approximately 20 milliseconds) for controlling an activation duration of an activation of a clamping device. The voltage on the ESD voltage rail ESD_BOOST 116 then charges common capacitive element 205 through the series combination of resistive elements 206, 207, 208, and 209. When common capacitive element 205 is charged to a voltage high enough to depress the voltage at node 218 enough to change the state of first driver block 202 and second driver block 203, the trigger signal TRIG at node 223 is deactivated, deactivating any clamping device controlled by it. Since the charging time is much slower than in the case with the lower resistance of the series combination of resistive elements 206 and 208, a longer activation duration is provided than was the case with the lower resistance of the series combination of resistive elements 206 and 208.

FIG. 3 is a schematic diagram illustrating a complementary metal oxide semiconductor (CMOS) implementation of a trigger circuit in accordance with at least one embodiment. Trigger circuit block 106 comprises control circuit block 204, variable timing circuit block 107, first driver block 342, and second driver block 343. Control circuit block 204 comprises P-channel MOSFET 331, P-channel MOSFET 332, P-channel MOSFET 333, N-channel MOSFET 334, and N-channel MOSFET 335. A voltage rail, such as ESD voltage rail ESD_BOOST 116, is connected to a source terminal of P-channel MOSFET 331, to a source terminal of P-channel MOSFET 332, and to a source terminal of P-channel MOSFET 333. A POR signal is connected to a gate terminal of P-channel MOSFET 331, for example, via signaling bus POR 119. A drain terminal of P-channel MOSFET 331 is connected to node 340, which is connected to a drain terminal of P-channel MOSFET 332, to a gate terminal of P-channel MOSFET 332, to a gate terminal of P-channel MOSFET 333, and to a drain terminal of N-channel MOSFET 334. A trigger signal TRIG at node 344 is connected to a gate terminal of N-channel MOSFET 334. A source terminal of N-channel MOSFET 334 is connected to negative voltage rail VSS 120. A drain terminal of P-channel MOSFET 333 is connected to node 341, which is connected to a drain terminal of N-channel MOSFET 335, to a gate terminal of N-channel MOSFET 335, and to a gate terminal of N-channel MOSFET 309 of variable timing circuit block 107. A source terminal of N-channel MOSFET 335 is connected to negative voltage rail VSS 120.

Variable timing circuit block 107 comprises common capacitive element 205, N-channel MOSFET 306, N-channel MOSFET 307, N-channel MOSFET 309, N-channel MOSFET 310, and N-channel MOSFET 311. A voltage rail, such as ESD voltage rail ESD_BOOST 116, is connected to a first terminal of common capacitive element 205 and to a gate terminal of N-channel MOSFET 306. A second terminal of common capacitive element 205 is connected to node 218, which is coupled to a drain terminal of N-channel MOSFET 306 and to a gate terminal of N-channel MOSFET 337 of first driver block 342. A source terminal of N-channel MOSFET 306 is connected to node 219, which is connected to a drain terminal of N-channel MOSFET 307, to a gate terminal of N-channel MOSFET 307, and to a drain terminal of N-channel MOSFET 310. A POR signal is connected to a gate terminal of N-channel MOSFET 310, for example, via signaling bus POR 119. A source terminal of N-channel MOSFET 307 is connected to node 320, which is connected to a drain terminal of N-channel MOSFET 309, to a source terminal of N-channel MOSFET 310, and to a drain terminal of N-channel MOSFET 311. An inverted trigger signal /TRIG at node 345, which may be an inverted version of the trigger signal TRIG at node 344 of control circuit block 204, is connected to a gate terminal of N-channel MOSFET 311. A negative voltage rail VSS 120 is connected to a source terminal of N-channel MOSFET 309 and to a source terminal of N-channel MOSFET 311.

First driver block 342 comprises resistive element 336 and N-channel MOSFET 337. A voltage rail, such as ESD voltage rail ESD_BOOST 116, is connected to a first terminal of resistive element 336. A second terminal of resistive element 336 is connected to a drain terminal of N-channel MOSFET 337 and to a gate terminal of P-channel MOSFET 338 of second driver block 343. A source terminal of N-channel MOSFET 337 is connected to negative voltage rail VSS 120.

Second driver block 343 comprises P-channel MOSFET 338 and resistive element 339. A voltage rail, such as ESD voltage rail ESD_BOOST 116, is connected to a source terminal of P-channel MOSFET 338. A drain terminal of P-channel MOSFET 338 is connected to a first terminal of resistive element 339 and to a trigger output, which may, for example, be communicated via signaling bus ESD_TRIGGER 117. A second terminal of resistive element 339 is connected to negative voltage rail VSS 120.

When the trigger signal TRIG at node 344 is at a high logic state, N-channel MOSFET 334 conducts current from node 340 to negative voltage rail VSS 120. This current is provided to node 320 via two current mirrors. P-channel MOSFET 332 and P-channel MOSFET 333 form a first current mirror with a built-in attenuation ratio, by virtue of transistor channel width-to-length ratio differences. For example, such an attention ratio may be approximately 20:1. N-channel MOSFET 335 and N-channel MOSFET 309 form a second current mirror with a built-in attenuation ratio, by virtue of transistor channel width-to-length ratio differences. For example, such an attenuation ratio may be approximately 20:1. The combined attenuation ratios of the current mirrors may yield a final attenuation ratio to control the current provided by N-channel MOSFET 309 of approximately 4,000:1. When the POR signal of signaling bus POR 119 is at a low logic level, P-channel MOSFET 331 conducts current from ESD voltage rail ESD_BOOST 116 into node 340. This current effectively further reduces the total current provided to the first current mirror and therefore also reduces the current provided by N-channel MOSFET 309. In one example, the reduction of the current provided by N-channel MOSFET 309 during a low logic level of the POR signal may be a factor of 4,000.

Desired interactions between MOSFETs in the FIG. 3 may be achieved by defining the MOSFET channel width-to-length ratios differently among the different MOSFETs. As an example, N-channel MOSFETs 334, 306, and 307 may be implemented as long-channel MOSFETs having a longer channels than, for example, P-channel MOSFET 333 or N-channel MOSFET 309. As another example, P-channel MOSFET 331, P-channel MOSFET 332, and N-channel MOSFET 335 may be implemented as wide-channel MOSFETs having wider channels than, for example, P-channel MOSFET 333 or N-channel MOSFET 309.

Since signals used by the trigger circuit may themselves be affected by a transient event, such signals may be latched or buffered to store their values before the ESD event and to prevent the effects of the transient event on those signals from adversely affecting the operation of the trigger circuit. For example, a POR signal may be latched or buffered to store what the POR signal was before the ESD event began to occur.

Figure 4:
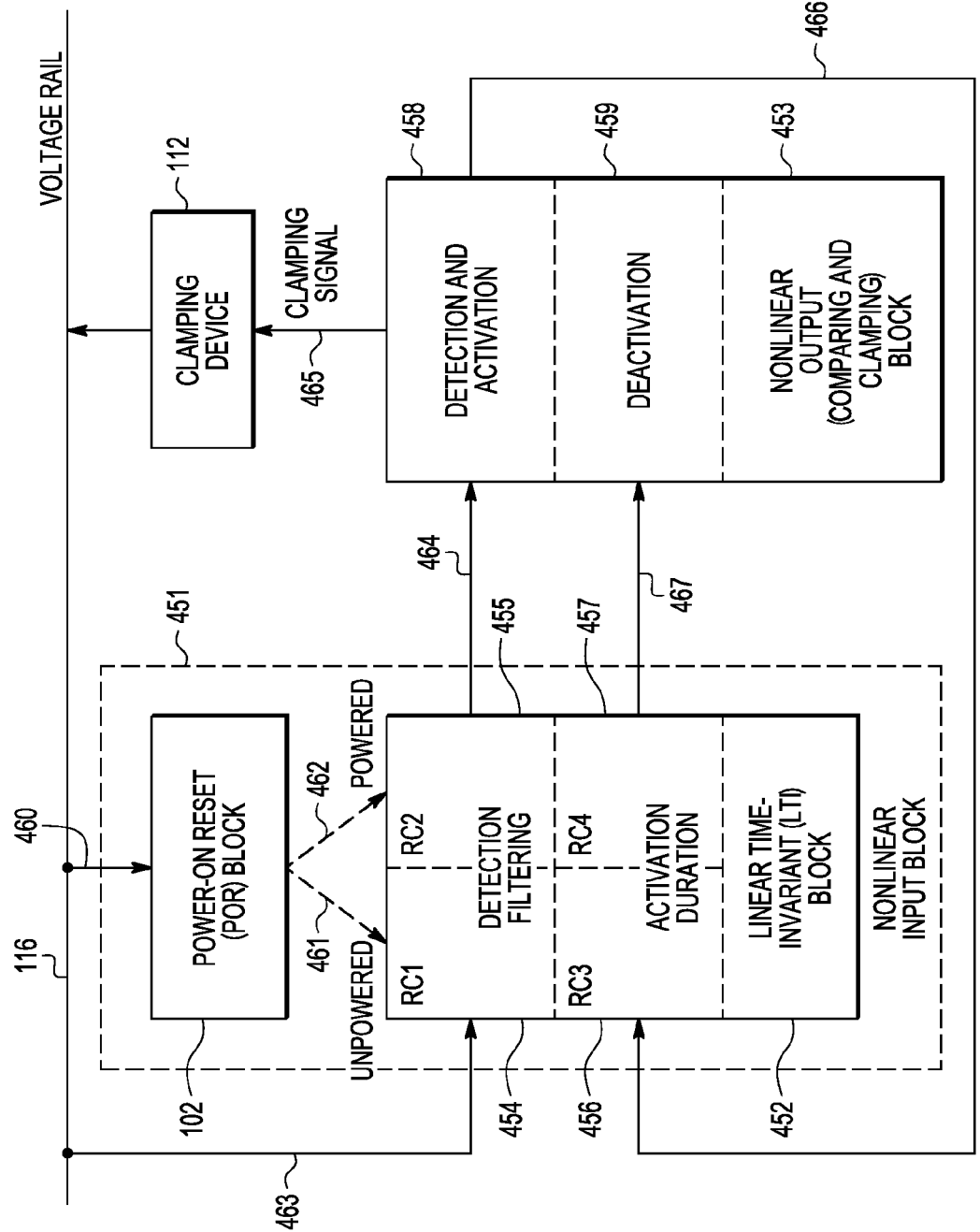
FIG. 4 is a block diagram illustrating a transient suppression system comprising a trigger circuit with a linear time-invariant (LTI) block for providing multiple time values in accordance with at least one embodiment.

FIG. 4 is a block diagram illustrating a transient suppression system comprising a trigger circuit with a linear time-invariant (LTI) block for providing multiple time values in accordance with at least one embodiment. The transient suppression system comprises a voltage rail, such as ESD voltage rail ESD_BOOST 116, a nonlinear input block 451, a nonlinear (comparing and clamping) output block 453, and a clamping device 112. Nonlinear output block 453 comprises a detection and activation portion 458 and a deactivation portion 459. Nonlinear input block 451 comprises ESD POR module 102 and linear time-invariant (LTI) block 452. LTI block 452 is illustrated as being divided into four quadrants 454, 455, 456, and 457 using variables RC1, RC2, RC3, and RC4, respectively. Quadrants 454 and 455 pertain to detection filtering, and quadrants 456 and 457 pertain to activation durations. Quadrants 454 and 456 pertain to an unpowered state of the integrated circuit on which the transient suppression system is fabricated, and quadrants 455 and 457 pertain to a powered state of the integrated circuit on which the transient suppression system is fabricated. The voltage rail is connected to input 463 of quadrants 454 and 455, allowing LTI block 452 to monitor the voltage rail for a transient voltage increase. The voltage rail is connected to input 460 of ESD POR module 102, allowing ESD POR module 102 to make a selection 461 for LTI block 452 to use variable RC1 of quadrant 454 or variable RC3 of quadrant 456, in the case where the integrated circuit is unpowered, or a selection 462 for LTI block 452 to use variable RC2 of quadrant 455 or variable RC4 of quadrant 457, in the case where the integrated circuit is powered.

In response to input 463, applying variable RC1 of quadrant 454 for the unpowered state or variable RC2 of quadrant 455 for the powered state, LTI block 452 provides an output 464 to a detection and activation portion 458 of nonlinear output block 453. The detection and activation portion 458 detects whether input 463, as filtered by LTI block 452 using variable RC1 of quadrant 454 for the unpowered state or variable RC 2 of quadrant 455 for the powered state, is or is not a transient voltage increase for which clamping should be activated (e.g., meeting slew rate criteria for clamping activation) and, if so, asserts a clamping signal at clamping output 465, which is connected to an input of clamping device 112, which is connected to the voltage rail and which clamps the voltage on the voltage rail. The detection and activation portion of nonlinear output block 453 provides trigger output 466, which is connected to activation duration quadrants 456 and 457 of LTI block 452 to allow LTI block 452 to begin controlling the activation duration of the clamping signal based on variable RC3 of quadrant 456 for the unpowered state or variable RC4 of quadrant 457 for the powered state. After the activation duration based on the appropriate variable value has elapsed, LTI block 452 asserts output 467, which is connected to deactivation portion 459 of nonlinear output block 453. Upon receipt of the deactivation signal provided by output 467, the deactivation portion 459 deactivates the clamping signal at clamping output 465, causing clamping device 112 to stop clamping the voltage at the voltage rail.

Figure 5:
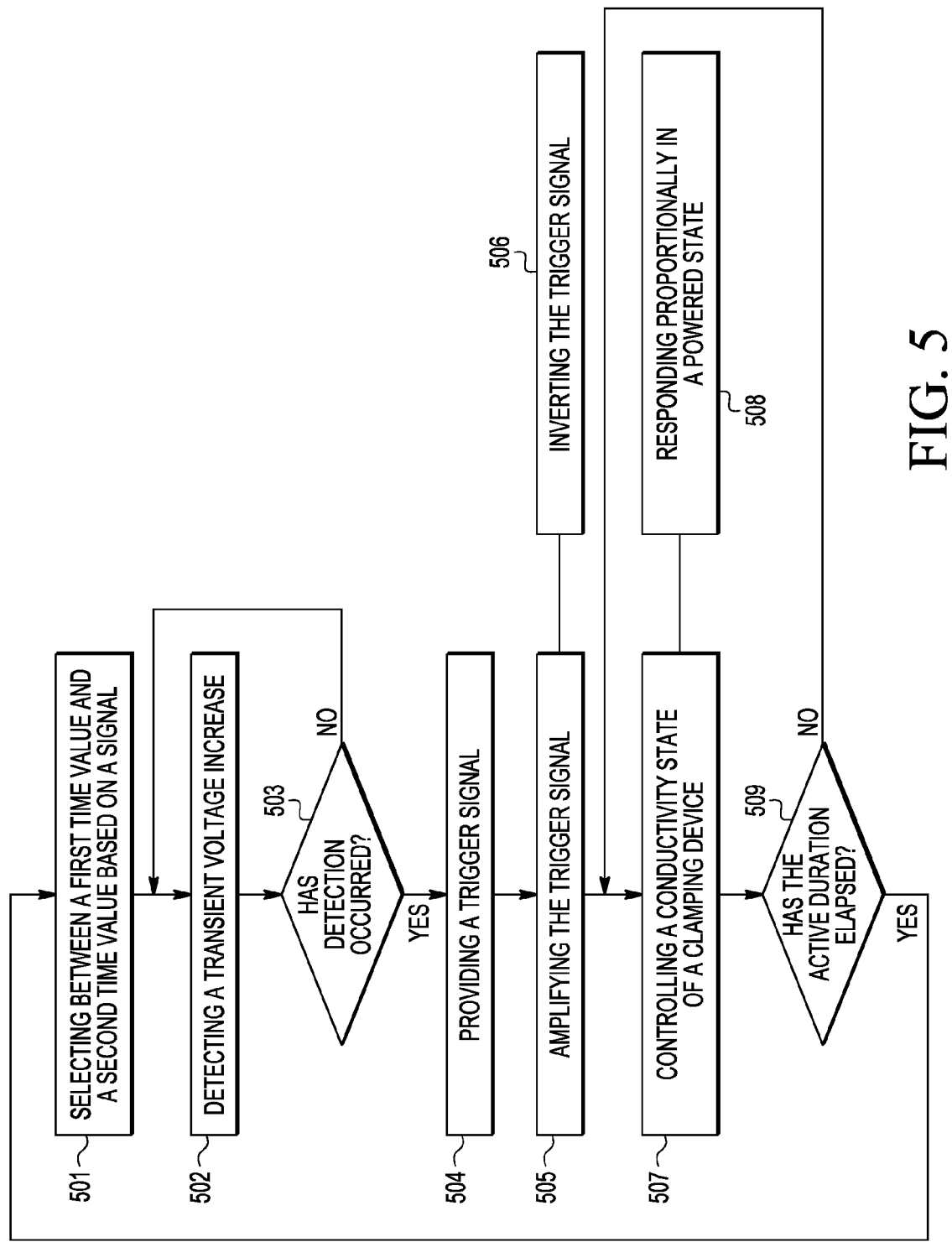
FIG. 5 is a flow diagram illustrating a method for detecting a transient voltage increase and controlling a conductivity state of a clamping device in accordance with at least one embodiment.

FIG. 5 is a flow diagram illustrating a method for detecting a transient voltage increase and controlling a conductivity state of a clamping device in accordance with at least one embodiment. The method begins in block 501 by selecting between a first time value and a second time value based on a signal. From block 501, the method continues to block 502. In block 502, detecting a transient voltage increase, if one is present, occurs. From block 502, the method continues to decision block 503. In decision block 503, a decision is made as to whether or not a detection of a transient voltage increase has occurred. If not, the method returns to block 502. If so, the method continues to block 504. In block 504, providing a trigger signal occurs. From block 504, the method continues to block 505. In block 505, amplifying the trigger signal occurs. As denoted by block 506, the amplifying the trigger signal of block 505 may comprises inverting the trigger signal. From block 505, the method continues to block 507. In block 507, controlling a conductivity state of a clamping device occurs. As denoted by block 508, the controlling the conductivity state of the clamping device may comprise responding proportionally when the integrated circuit is in a powered state, which can prevent the voltage rail from collapsing and a reset from occurring. From block 507, the method continues to decision block 509, where a decision is made as to whether or not the active duration has elapsed. If not, the method returns to block 507. If so, the method returns to block 501.

Figure 6:
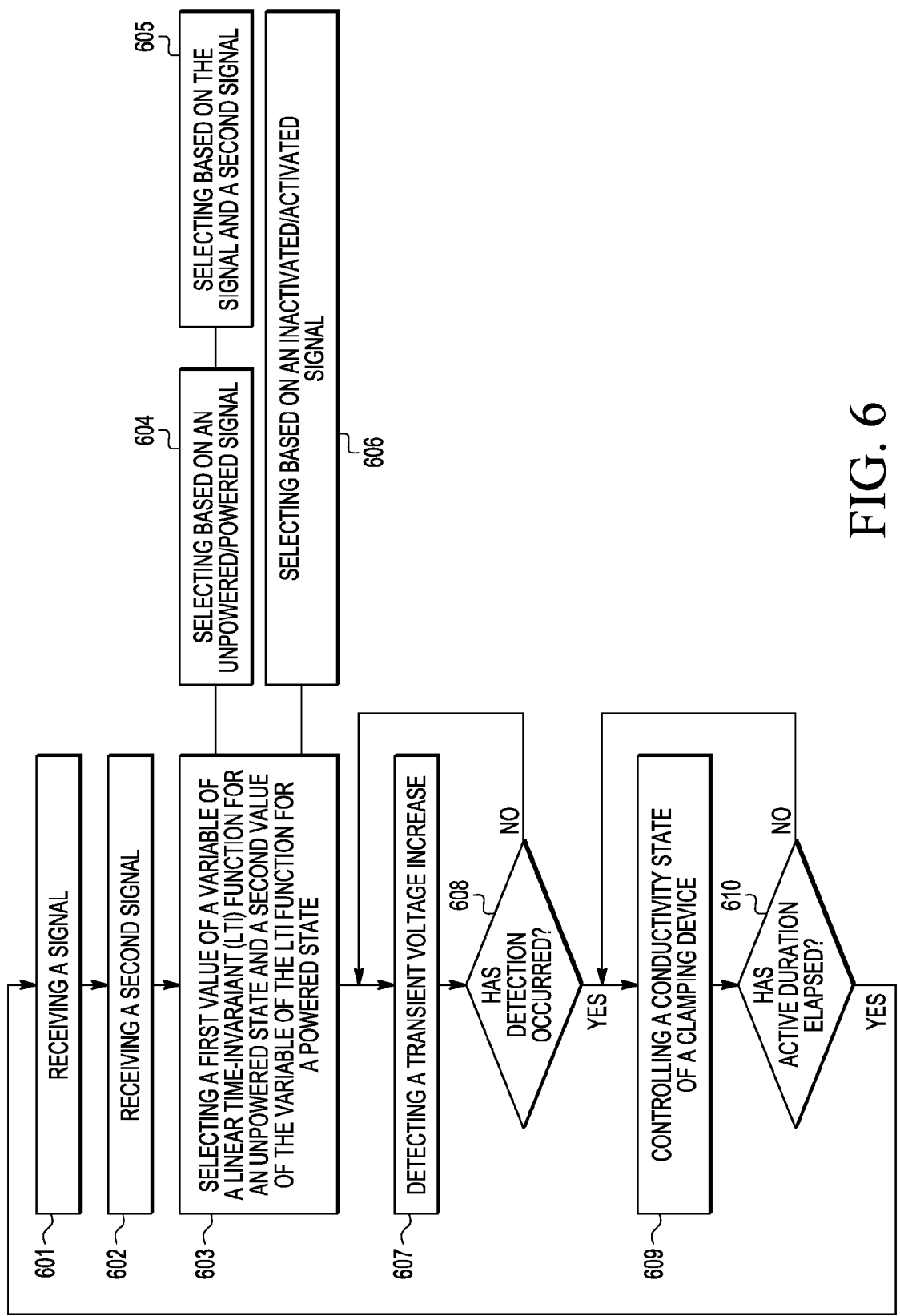
FIG. 6 is a flow diagram illustrating a method for detecting a transient voltage increase and controlling a conductivity state of a clamping device in accordance with at least one embodiment.

FIG. 6 is a flow diagram illustrating a method for detecting a transient voltage increase and controlling a conductivity state of a clamping device in accordance with at least one embodiment. The method begins in block 601 by receiving a signal. From block 601, the method continues to block 602. In block 602, receiving a second signal occurs. From block 602, the method continues in block 603. In block 603, selecting a first value of a variable of a linear time-invariant (LTI) function for an unpowered state and a second value of the variable of the LTI function for a powered state occurs, depending on whether the integrated circuit is in the unpowered state or in the powered state. As denoted by block 604, the operation of block 603 may comprise selecting the first value or the second value may be performed based on an unpowered/powered signal representative of the unpowered state or the powered state. As denoted by block 605, the operation of block 604 may comprise selecting the first value or the second value based on the signal and a second signal. The selecting may comprise selecting between a first value, a second value, a third value, and a fourth value based on the signal and the second signal. As denoted by block 606, the operation of block 603 may comprise selecting based on an inactivated/activated signal. The inactivated/activated signal may be representative of an inactivated state or an activated state of controlling the conductivity state of a clamping device. From block 603, the method continues to block 607. In block 607, detecting a transient voltage increase, if one is present, occurs. From block 607, the method continues to decision block 608. In decision block 608, a decision is made as to whether or not a detection of a transient voltage increase has occurred. If not, the method returns to block 607. If so, the method continues to block 609. In block 609, controlling a conductivity state of clamping device occurs. From block 609, the method continues to decision block 610. In decision block 610, a decision is made as to whether or not an active duration of the clamping has elapsed. If not, the method returns to block 609. If so, the method returns to block 601.

In accordance with at least one embodiment, a triggering sensitivity of the trigger circuit is dependent on the first time value or the second time value as a basis of comparison for a rate of change of a voltage at a circuit node, which may, for example, be a voltage rail or any other node in any circuit for which transient suppression is desired. The trigger circuit triggers the clamping element when the rate of change is greater than a rate of change corresponding to the first time value or the second time value and does not trigger the clamping element when the rate of change is less than the rate of change corresponding to the first time value and the second time value.

Unlike existing ESD protection networks for CMOS products with a rise time detector and a latch that fully turns on the rail clamp when ESD is detected, which may not respond well to powered transient events (i.e. system level stress) because the active rail clamp either doesn't turn on at all or it turns on fully, which can cause a positive voltage rail VDD to collapse and the chip to go into reset, at least one embodiment distinguishes between unpowered ESD and powered transient events and enters a voltage regulation mode rather than a latched clamp turn-on mode during a powered transient event. In this regulation mode, the trigger circuit turns on in proportion to a supply voltage increase, thereby avoiding a collapsing supply.

At least one embodiment, based on a proportional triggering scheme, avoids a need for a remote voltage reference circuit. Such a remote reference voltage (Vref) generator may occupy a substantial amount of die area, may be prone to functional issues (e.g., direct current (DC) leakage during power-up, sensitivity to nearby current injection, and the like), and its remote placement from the TCs may cause signaling issues and performance issues, for example, due to voltage drops on power buses. Conductors of integrated circuits tend to be small and resistive compared to conductors of discrete circuit. Voltage drops can result from current flowing through the relatively high resistance of a an integrated circuit conductor, such as an IC power bus, where the voltage drop is equal to the current flowing through the conductor times the resistance of the conductor, in accordance with Ohm's law. Moreover, in a situation where multiple TCs are connected together and at least one of them experiences a large voltage drop, false triggering of that one TC can result in widespread malfunctions. By eliminating the need for a standalone Vref generator, independence from relatively resistive integrated circuit conductors can be achieved and false triggering of TCs can be avoided. Thus, savings in die area (e.g., cost), increases the functional reliability of the chip, and improvement of the ESD clamp response during transient stress events (e.g., ESD response performance improvement) can be realized.

In accordance with at least one embodiment, a trigger circuit (TC) is provided that can provide different ESD clamp triggering responses by distinguishing between unpowered and powered chip operation. Such a TC receives a POR ("power-on reset") signal to make that distinction, the POR signal can be provided, for example, by a small ESD POR circuit included in the pad ring (e.g., in VSS pads). Such a TC can function without the need for a separate voltage reference (Vref) generator circuit. Different ESD responses are achieved in the TC by switching the resistor value in the RC detection stage based on the logic states of the POR signal and the trigger circuit output node. The combination of the selectable resistor value and a common capacitor value that can remain the same for all selectable resistor values provides a resistance-capacitance (RC) time value, thereby allowing the several selectable resistor values in combination with the common capacitor value to provide several RC time values, which are utilized to provide several ESD responses as a function of the POR signal and the trigger signal. The proportional triggering mode during powered transient stress events is achieved by choosing a large R value. The initial supply voltage gets therefore stored on the capacitor C providing an internal reference voltage for the TC, thereby avoiding the need for a remote voltage reference circuit and the problems associated with trigger circuits relying on a remote voltage reference circuit.

In accordance with at least one embodiment, the trigger circuit comprises an RC filter stage in which the R*C value can be switched depending on control signals. In accordance with at least one embodiment, the trigger circuit comprises one or more inverter stages to detect and amplify the output signal of the RC filter stage, the output of the inverter stage(s) (TC output) driving the Gate terminal of one or more rail clamp devices. In accordance with at least one embodiment, the trigger circuit receives a POR signal that is at a high logic level whenever there is an increase in voltage (i.e., a voltage ramp) starting from zero volts at a node or bus (e.g., on the ESD_BOOST voltage rail) monitored by the POR circuit and at a low logic level when the chip is fully powered up. For example, the POR signal is at a high logic level during a power-up (i.e., when power is initially applied to the integrated circuit) or an unpowered ESD event and at a low logic level when the chip is fully powered up (e.g., during a powered ESD event). In accordance with at least one embodiment, the trigger circuit comprises control logic that sets the operating mode of the TC by modifying the R*C value. The POR signal and the TC output (trigger) signals serve as inputs to the control logic. In accordance with at least one embodiment, the trigger circuit provides four different time values based on the RC elements. For example, when the integrated circuit is in an unpowered state (e.g., POR signal=1), the trigger circuit provides a time value of approximately 100 ns for transient event detection and a time value of approximately 5 μs for the on-time of the active clamping response, and when the integrated circuit is in a powered state (e.g., POR signal=0), the trigger circuit provides a time value of approximately 10 μs for transient event detection and a time value of approximately 20 ms for the on-time of the active clamping response.

In accordance with at least one embodiment, a time value for controlling a detection range for an unpowered state of an integrated circuit is between IO nanoseconds and 1 microsecond. In accordance with at least one embodiment, a time value for controlling a detection range for an unpowered state of an integrated circuit is between 20 nanoseconds and 500 nanoseconds. In accordance with at least one embodiment, a time value for controlling a detection range for an unpowered state of an integrated circuit is between 50 nanoseconds and 200 nanoseconds.

In accordance with at least one embodiment, a time value for controlling a detection range for a powered state of an integrated circuit is between 1 microsecond and 100 microseconds. In accordance with at least one embodiment, a time value for controlling a detection range for a powered state of an integrated circuit is between 2 microseconds and 50 microseconds. In accordance with at least one embodiment, a time value for controlling a detection range for a powered state of an integrated circuit is between 5 microseconds and 20 microseconds.

In accordance with at least one embodiment, a time value for controlling an activation duration for an unpowered state of an integrated circuit is between 500 nanoseconds and 50 microseconds. In accordance with at least one embodiment, a time value for controlling an activation duration for an unpowered state of an integrated circuit is between 1 microsecond and 20 microseconds. In accordance with at least one embodiment, a time value for controlling an activation duration for an unpowered state of an integrated circuit is between 2 microseconds and 10 microseconds.

In accordance with at least one embodiment, a time value for controlling an activation duration for a powered state of an integrated circuit is between 2 milliseconds and 200 milliseconds. In accordance with at least one embodiment, a time value for controlling an activation duration for a powered state of an integrated circuit is between 5 milliseconds and 100 milliseconds. In accordance with at least one embodiment, a time value for controlling an activation duration for a powered state of an integrated circuit is between 10 milliseconds and 50 milliseconds.

In accordance with at least one embodiment, a time value for controlling a detection range is approximately 100 times greater for a powered state of an integrated circuit than for an unpowered state of the integrated circuit. In accordance with at least one embodiment, a time value for controlling a detection range is between 50 and 200 times greater for a powered state of an integrated circuit than for an unpowered state of the integrated circuit.

In accordance with at least one embodiment, a time value for controlling an activation duration is approximately 4,000 times greater for a powered state of an integrated circuit than for an unpowered state of the integrated circuit. In accordance with at least one embodiment, a time value for controlling an activation duration is between 1,000 and 10,000 times greater for a powered state of an integrated circuit than for an unpowered state of the integrated circuit.

In accordance with at least one embodiment, a time value for controlling an activation duration for an unpowered state of an integrated circuit is approximately 50 times greater than a time value for controlling a detection range for the unpowered state of the integrated circuit. In accordance with at least one embodiment, a time value for controlling an activation duration for an unpowered state of an integrated circuit is between 20 and 100 times greater than a time value for controlling a detection range for the unpowered state of the integrated circuit.

In accordance with at least one embodiment, a time value for controlling an activation duration for a powered state of an integrated circuit is approximately 2,000 times greater than a time value for controlling a detection range for the powered state of the integrated circuit. In accordance with at least one embodiment, a time value for controlling an activation duration for a powered state of an integrated circuit is between 500 and 10,000 times greater than a time value for controlling a detection range for the powered state of the integrated circuit.

In accordance with at least one embodiment, an ESD TC that can operate in two modes, a regular on/off style triggering mode (for unpowered transient stress events) and a proportional regulation mode (for powered transient stress events) is provided. Such an ESD TC does not need a separate voltage reference circuit (Vref). Switching the detection RC time value in the transient ESD trigger circuit is utilized to achieve two modes of operation (unpowered vs. powered). The powered mode of operation responds to transient voltage increase proportionally, allowing it to avoid collapsing the supply voltage on a voltage rail and causing an unintended reset of the system.

In accordance with at least one embodiment, die size reduction can be achieved due to a smaller I/O pad layout area requirement. In accordance with at least one embodiment, improved transient immunity performance can be provided for CMOS semiconductor products.

In accordance with at least one embodiment, a trigger circuit for detecting a transient voltage increase in an integrated circuit may be defined in a voltage-tolerant circuit design library. Such a voltage-tolerant circuit design library may be used for implementing integrated circuit IO pins at which a voltage above a positive voltage rail VDD 118 may occur.

In accordance with at least one embodiment, a trigger circuit for detecting a transient voltage increase in an integrated circuit enables remote placement of multiple local trigger circuits and avoids trigger circuit contention among the multiple local trigger circuits even if the multiple local trigger circuits are configured to communicate their trigger signals with each other or recognize the trigger signals of others of the multiple local trigger circuits.

In accordance with at least one embodiment, a method comprises detecting a transient voltage increase on an integrated circuit and controlling a conductivity state of a clamping device to limit the transient voltage increase. At least one of the detecting and the controlling are dependent upon a first time value and a second time value. The first time value is applicable to an unpowered state of the integrated circuit, and the second time value is applicable to a powered state of the integrated circuit. The first time value and the second time value are dependent upon a capacitive value of a common capacitive element. In accordance with at least one embodiment, the detecting is dependent upon the first time value and the second time value, and the detecting occurs in response to a rate of transient voltage increase being within a detection range, the detection range being dependent upon the first time value for the unpowered state of the integrated circuit and the second time value for the powered state of the integrated circuit. In accordance with at least one embodiment, the controlling is dependent upon the first time value and the second time value, and the controlling occurs for an active duration, the active duration being dependent upon the first time value for the unpowered state of the integrated circuit and the second time value for the powered state of the integrated circuit. In accordance with at least one embodiment, the method further comprises selecting between the first time value and the second time value based on a signal responsive to the unpowered state and the powered state of the integrated circuit. In accordance with at least one embodiment, the controlling the conductivity state of the clamping device to limit the transient voltage increase comprises responding to the transient voltage increase in the powered state in proportion to the transient voltage increase relative to a preexisting voltage of the powered state. In accordance with at least one embodiment, the method further comprises providing a trigger signal in response to the detecting the transient voltage increase and amplifying the trigger signal. In accordance with at least one embodiment, the amplifying the trigger signal comprises inverting the trigger signal. In accordance with at least one embodiment, the detecting is dependent upon the first time value and the second time value and the controlling is dependent upon a third time value and a fourth time value, wherein the third time value and the fourth time value are dependent upon the capacitive value of the common capacitive element. In accordance with at least one embodiment, the detecting occurs in response to a rate of transient voltage increase being within a detection range, the detection range being dependent upon the first time value for the unpowered state of the integrated circuit and the second time value for the powered state of the integrated circuit, wherein the controlling occurs for an active duration, the active duration being dependent upon the third time value for the unpowered state of the integrated circuit and the fourth time value for the powered state of the integrated circuit. In accordance with at least one embodiment, the first time value is unequal to the second time value.

In accordance with at least one embodiment, an integrated circuit comprises a clamping device and a trigger circuit for detection of a transient voltage increase on the integrated circuit. The trigger circuit controls a conductivity state of the clamping device to limit the transient voltage increase. The trigger circuit comprises a common capacitive element having a capacitive value. A first time value and a second time value are dependent upon the capacitive value of the common capacitive element. The first time value is applicable to an unpowered state of the integrated circuit and the second time value is applicable to a powered state of the integrated circuit. The first time value and the second time value control a trigger circuit parameter selected from a group consisting of a detection range within which a rate of transient voltage increase causes the trigger circuit to become active and an "on" time upon which an active duration of the controlling of the conductivity state of the clamping device depends. In accordance with at least one embodiment, the first time value determines the detection range for the unpowered state of the integrated circuit, and the second time value determines the detection range for the powered state of the integrated circuit. In accordance with at least one embodiment, the trigger circuit comprises a driver circuit having an input coupled to the common capacitive element, the driver circuit comprising one or more inverter stages to detect and amplify a filtered signal at the input and to provide a trigger circuit output signal to drive a control terminal of the clamping device. In accordance with at least one embodiment, the trigger circuit controls the clamping device to provide higher conductivity when the integrated circuit is in the unpowered state and controlled lower conductivity to provide voltage regulation when the integrated circuit is in the powered state. In accordance with at least one embodiment, the trigger circuit has a third time value for determining the active duration of the higher conductivity during the unpowered state of the integrated circuit and a fourth time value for determining the active duration of the controlled lower conductivity during the powered state of the integrated circuit, wherein the third time value and the fourth time value are dependent upon the capacitive value of the common capacitive element.

In accordance with at least one embodiment, a method comprises selecting a first value of a variable of a linear time-invariant (LTI) function for an unpowered state of an integrated circuit and a second value of the variable of the linear time-invariant (LTI) function for a powered state of the integrated circuit, wherein the first value and the second value are dependent upon a common reactive element, detecting a transient voltage increase on the integrated circuit, and controlling a conductivity state of a clamping device to limit the transient voltage increase, wherein at least one of the detecting and the controlling are dependent upon the LTI function. In accordance with at least one embodiment, the detecting is dependent upon the LTI function and the detecting occurs in response to a rate of transient voltage increase being within a detection range, the detection range being dependent upon the LTI function. In accordance with at least one embodiment, the controlling is dependent upon the LTI function and the controlling occurs for an active duration, the active duration being dependent upon the LTI function. In accordance with at least one embodiment, the method further comprises receiving a signal responsive to the unpowered state and the powered state of the integrated circuit, wherein the selecting further comprises selecting between the first value and the second value of the variable of the LTI function based on the signal. In accordance with at least one embodiment, the method further comprises receiving a second signal, wherein the second signal represents an inactivated state of the controlling a conductivity state of a clamping device in a first state of the second signal and an activated state of the controlling a conductivity state of a clamping device in a second state of the second signal, wherein the selecting between the first value and the second value of the variable of the LTI function comprises selecting, based on the signal and the second signal, the first value of the variable of the LTI function for the detecting for the unpowered state of the integrated circuit, the second value of the variable of the LTI function for the detecting for the powered state of the integrated circuit, a third value of the variable of the LTI function for the controlling for the unpowered state of the integrated circuit, and a fourth value of the variable of the LTI function for the controlling for the powered state of the integrated circuit, wherein the first value, the second value, the third value, and the fourth value are dependent upon the common reactive element. In accordance with at least one embodiment, the signal is a power-on reset (POR) signal. In accordance with at least one embodiment, the method further comprises receiving a signal responsive to an inactivated state and an activated state of the controlling the conductivity of the clamping devices, wherein the selecting comprises selecting whether to apply the first value and the second value of the variable of the LTI function to the detecting or to the controlling based on the signal.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method comprising:
   detecting a transient voltage increase on an integrated circuit; and
   controlling a conductivity state of a clamping device to limit the transient voltage increase, wherein at least one of the detecting and the controlling are dependent upon a first time value and a second time value, the first time value applicable to an unpowered state of the integrated circuit and the second time value applicable to a powered state of the integrated circuit, wherein the first time value and the second time value are dependent upon a capacitive value of a common capacitive element, wherein the controlling is dependent upon the first time value and the second time value and wherein the controlling occurs for an active duration, the active duration being dependent upon the first time value for the unpowered state of the integrated circuit and the second time value for the powered state of the integrated circuit.

2. The method of claim 1 wherein the detecting is dependent upon the first time value and the second time value and wherein the detecting occurs in response to a rate of transient voltage increase being within a detection range, the detection range being dependent upon the first time value for the unpowered state of the integrated circuit and the second time value for the powered state of the integrated circuit.

3. The method of claim 1 further comprising:
   selecting between the first time value and the second time value based on a signal responsive to the unpowered state and the powered state of the integrated circuit.

4. The method of claim 1 wherein the controlling the conductivity state of the clamping device to limit the transient voltage increase comprises:
   responding to the transient voltage increase in the powered state in proportion to the transient voltage increase relative to a preexisting voltage of the powered state.

5. The method of claim 1 wherein the detecting is dependent upon the first time value and the second time value and wherein the controlling is dependent upon a third time value and a fourth time value, wherein the third time value and the fourth time value are dependent upon the capacitive value of the common capacitive element.

6. The method of claim 5, wherein the detecting occurs in response to a rate of transient voltage increase being within a detection range, the detection range being dependent upon the first time value for the unpowered state of the integrated circuit and the second time value for the powered state of the integrated circuit, wherein the controlling occurs for an active duration, the active duration being dependent upon the third time value for the unpowered state of the integrated circuit and the fourth time value for the powered state of the integrated circuit.

7. The method of claim 1 wherein the first time value is unequal to the second time value.

8. An integrated circuit comprising:
   a clamping device; and
   a trigger circuit for detection of a transient voltage increase on the integrated circuit, the trigger circuit controlling a conductivity state of the clamping device to limit the transient voltage increase, wherein the trigger circuit controls the clamping device to provide higher conductivity when the integrated circuit is in an unpowered state and controlled lower conductive to provide voltage regulation when the integrated circuit is in a powered state, the trigger circuit comprising:
      a common capacitive element having a capacitive value, wherein a first time value and a second time value are dependent upon the capacitive value of the common capacitive element, the first time value applicable to the unpowered state of the integrated circuit and the second time value applicable to the powered state of the integrated circuit, wherein the first time value and the second time value control a trigger circuit parameter selected from a group consisting of:
- a detection range within which a rate of transient voltage increase causes the trigger circuit to become active; and
- an "on" time upon which an active duration of the controlling of the conductivity state of the clamping device depends.

9. The integrated circuit of claim 8, wherein the first time value determines the detection range for the unpowered state of the integrated circuit and the second time value determines the detection range for the powered state of the integrated circuit.

10. The integrated circuit of claim 9 wherein the trigger circuit has a third time value for determining the active duration of a higher conductivity during the unpowered state of the integrated circuit and a fourth time value for determining the active duration of a controlled lower conductivity during the powered state of the integrated circuit, wherein the third time value and the fourth time value are dependent upon the capacitive value of the common capacitive element.

11. The integrated circuit of claim 8 wherein the trigger circuit comprises:
a driver circuit having an input coupled to the common capacitive element, the driver circuit comprising one or more inverter stages to detect and amplify a filtered signal at the input and to provide a trigger circuit output signal to drive a control terminal of the clamping device.

12. A method comprising:
selecting a first value of a variable of a linear time-invariant (LTI) function for an unpowered state of an integrated circuit and a second value of the variable of the linear time-invariant (LTI) function for a powered state of the integrated circuit, wherein the first value and the second value are dependent upon a common reactive element;
detecting a transient voltage increase on the integrated circuit; and
controlling a conductivity state of a clamping device to limit the transient voltage increase, wherein the controlling is dependent upon the LTI function and wherein the controlling occurs for an active duration, the active duration being dependent upon the LTI function.

13. The method of claim 12 wherein the detecting is dependent upon the LTI function and wherein the detecting occurs in response to a rate of transient voltage increase being within a detection range, the detection range being dependent upon the LTI function.

14. The method of claim 12 further comprising:
receiving a signal responsive to the unpowered state and the powered state of the integrated circuit, wherein the selecting further comprises:
selecting between the first value and the second value of the variable of the LTI function based on the signal.

15. The method of claim 14 further comprising:
receiving a second signal, wherein the second signal represents an inactivated state of the controlling a conductivity state of a clamping device in a first state of the second signal and an activated state of the controlling a conductivity state of a clamping device in a second state of the second signal, wherein the selecting between the first value and the second value of the variable of the LTI function comprises:
selecting, based on the signal and the second signal, the first value of the variable of the LTI function for the detecting for the unpowered state of the integrated circuit, the second value of the variable of the LTI function for the detecting for the powered state of the integrated circuit, a third value of the variable of the LTI function for the controlling for the unpowered state of the integrated circuit, and a fourth value of the variable of the LTI function for the controlling for the powered state of the integrated circuit, wherein the first value, the second value, the third value, and the fourth value are dependent upon the common reactive element.

16. The method of claim 14 wherein the signal is a power-on reset (POR) signal.

17. The method of claim 12 further comprising:
receiving a signal responsive to an inactivated state and an activated state of the controlling the conductivity of the clamping devices, wherein the selecting comprises:
selecting whether to apply the first value and the second value of the variable of the LTI function to the detecting or to the controlling based on the signal.

* * * * *